(12) United States Patent
Ookawa et al.

(10) Patent No.: US 6,758,941 B1
(45) Date of Patent: Jul. 6, 2004

(54) PLASMA PROCESSING UNIT, WINDOW MEMBER FOR PLASMA PROCESSING UNIT AND ELECTRODE PLATE FOR PLASMA PROCESSING UNIT

(75) Inventors: Yoshihito Ookawa, Kofu (JP); Daisuke Hayashi, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 207 days.

(21) Appl. No.: 09/980,309
(22) PCT Filed: Jun. 1, 2000
(86) PCT No.: PCT/JP00/03543
§ 371 (c)(1),
(2), (4) Date: Nov. 30, 2001
(87) PCT Pub. No.: WO00/75973
PCT Pub. Date: Dec. 14, 2000

(30) Foreign Application Priority Data
Jun. 2, 1999 (JP) .......................................... 11-155539
(51) Int. Cl.[7] .............................................. H01L 21/00
(52) U.S. Cl. ............................ 156/345.47; 156/345.43; 118/723 E
(58) Field of Search ............................ 118/723 E, 712, 118/714, 713, 715, 723, 723 ER, 723 R; 156/345.43, 345.44, 345.45, 345.46, 345.47, 345.24, 345.25; 216/60; 438/7

(56) References Cited
U.S. PATENT DOCUMENTS
4,328,068 A * 5/1982 Curtis .......................... 216/60
5,023,188 A * 6/1991 Tanaka ........................... 438/8

(List continued on next page.)

FOREIGN PATENT DOCUMENTS
JP  59-186325  10/1984
JP  61-187335   8/1986

(List continued on next page.)

OTHER PUBLICATIONS

PCT Notification of Transmittal of Copies of Translation of the International Preliminary Examination Report (PCT/IB/338) issued for PCT/JP00/03543.
International Preliminary Examination Report (PCT/IPEA/409) (translated) issued for PCT/JP00/03543.

Primary Examiner—Gregory Mills
Assistant Examiner—Michelle Crowell
(74) Attorney, Agent, or Firm—Smith, Gambrell & Russell, LLP

(57) ABSTRACT

A plasma processing unit of the invention includes: a processing container, and a first electrode disposed in the processing container. The first electrode has: a plurality of gas-dispersion holes for supplying a process gas into the processing container, and an opening for a measurement light. A second electrode is arranged on one side of and a predetermined gap away from the gas-dispersion holes and the opening of the first electrode. A power source unit applies electric power between the first electrode and the second electrode and generates plasma between the first electrode and the second electrode. An optical path of a window member adjacently communicates with the other side of the opening for the measurement light. The gas-dispersion holes are formed into a predetermined arrangement, and the opening is formed separately from the gas-dispersion holes without disturbing the arrangement of the gas-dispersion holes. According to the invention, a process gas can be uniformly supplied into the processing container to conduct a uniform plasma process, in spite of existence of the opening and the optical path as a window for monitoring.

8 Claims, 2 Drawing Sheets

U.S. PATENT DOCUMENTS

| | | | | |
|---|---|---|---|---|
| 5,444,207 | A | * | 8/1995 | Sekine et al. .......... 219/121.43 |
| 6,159,297 | A | * | 12/2000 | Herchen et al. ............ 118/708 |
| 6,390,019 | B1 | * | 5/2002 | Grimbergen et al. ... 118/723 R |

FOREIGN PATENT DOCUMENTS

| | | | | |
|---|---|---|---|---|
| JP | 63-124418 | | 5/1988 | |
| JP | 2-23617 | | 1/1990 | |
| JP | 2-201924 | | 8/1990 | |
| JP | 3-82019 | | 4/1991 | |
| JP | 3-104212 | | 5/1991 | |
| JP | 3-148118 | | 6/1991 | |
| JP | 4-94533 | | 3/1992 | |
| JP | 5-160111 | | 6/1993 | |
| JP | 06021003 A | * | 1/1994 | ......... H01L/21/302 |
| JP | 06120177 A | * | 4/1994 | ......... H01L/21/302 |
| JP | 7-111246 | | 4/1995 | |
| JP | 10-64884 | | 3/1998 | |

\* cited by examiner

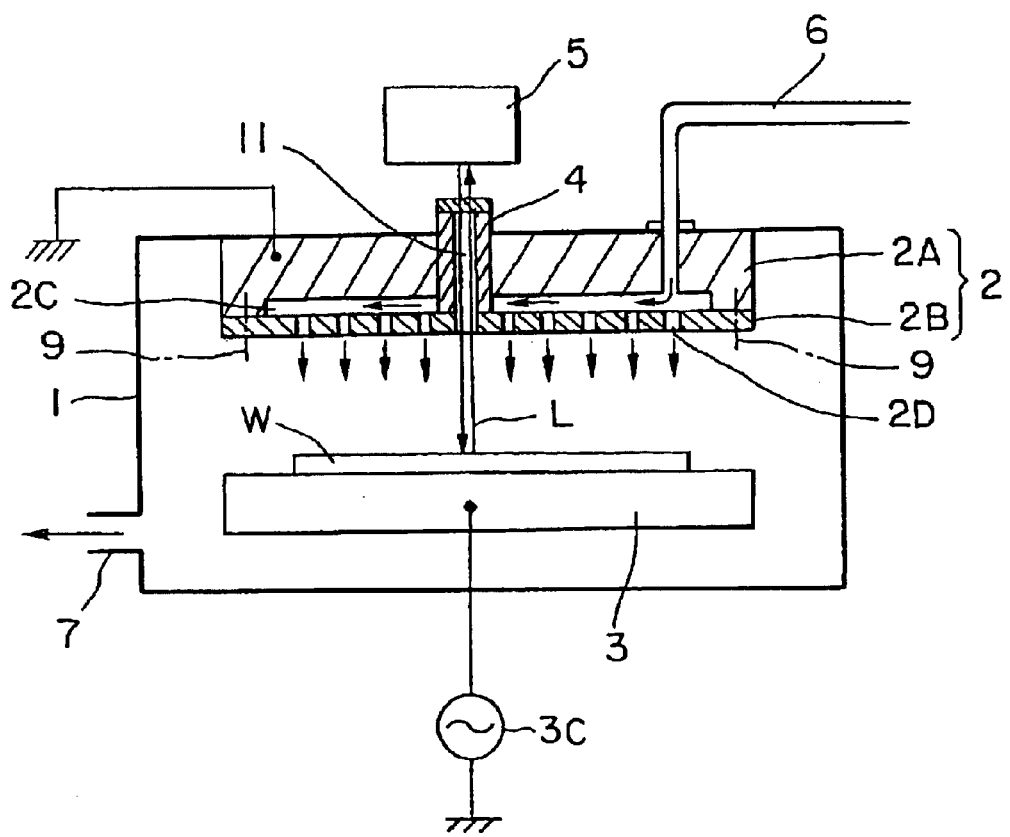
F I G. 1
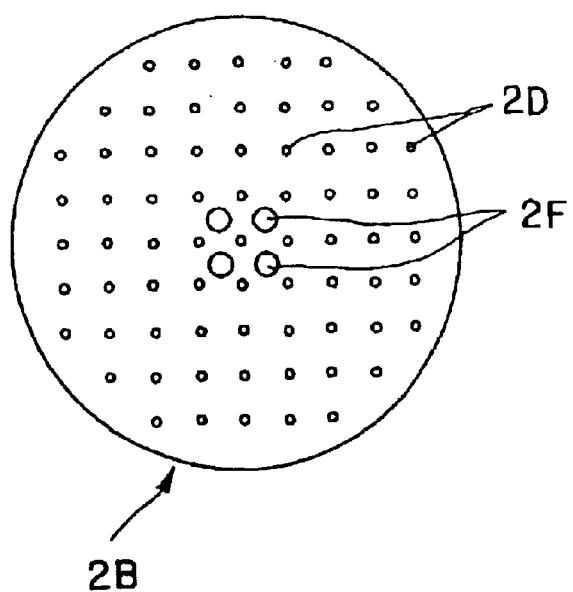
F I G. 2

PLASMA PROCESSING UNIT, WINDOW MEMBER FOR PLASMA PROCESSING UNIT AND ELECTRODE PLATE FOR PLASMA PROCESSING UNIT

FIELD OF THE INVENTION

This invention relates to a plasma processing unit, a window member for a plasma processing unit and an electrode plate for a plasma processing unit.

BACKGROUND OF THE INVENTION

In Japanese Patent Laid-Open Publications No. 4-94533 and No. 10-64884, a technique has been proposed wherein a window which a beam of light can penetrate is provided at a central portion of an electrode facing another electrode on which a wafer is placed, and wherein reflection of a beam of light given from an outside of an etching unit to the wafer is detected by means of a detector disposed at the outside of the etching unit in order to monitor an etching state. In addition, in Japanese Patent Laid-Open Publication No. 2-201924, a technique has been proposed wherein two optical fibers extend through an ozone-dispersion plate from an outside of a heating-type ashing unit, and wherein a beam of light is given to a wafer facing the ozone-dispersion plate through one of the optical fibers and reflection of the beam from the wafer Is received through the other of the optical fibers by means of a detector disposed at the outside of the unit in order to monitor an ashing state.

In cases of the monitoring techniques disclosed in the Japanese Patent Laid-Open Publications No. 4-94533 and No. 10-64884, an electric field between electrodes may be affected by a shape of the window for monitoring and a shape of each of the electrodes, and hence it may be difficult to uniformly conduct a plasma process. However, the shapes thereof are not taken into consideration at all. In addition, if an optical fiber reaches a surface of an electrode as shown in the latter publication, an electric field between electrodes may be affected by the optical fiber, and furthermore reaction products may stick to the optical fiber so that a transmissivity of the optical fiber may be deteriorated. However, the points are not taken into consideration at all. In cases of the monitoring technique disclosed in the Japanese Patent Laid-Open Publications No. 2-201924, since the optical fibers extend through the ozone-dispersion plate and are subjected to an ashing environment, reaction products may stick to the optical fibers so that a transmissivity of the optical fibers may be deteriorated. However, the points are not taken into consideration at all.

In some types of plasma processing units, dispersion holes for supplying a gas are formed in the whole surface of an electrode. Regarding a window for monitoring in the some types of plasma processing units, a larger window for monitoring is necessary in order to secure a quantity of light sufficient for monitoring, in comparison with the gas-dispersion holes. Thus, a plurality of the gas-dispersion holes are sacrificed for the window for monitoring, that is, the process gas cannot be supplied through the sacrificed gas-dispersion holes. Therefore, there is a problem that density of the process gas may become ununiform between the electrodes, and hence that plasma density may become ununiform, and hence that uniformity of the plasma process may be deteriorated. In addition, if the size of a window for monitoring is large, the plasma may be diffused into an optical path of the window for monitoring and hence suspended particles and/or reaction products in the plasma may fog up the quartz glass in a short time (for example about 30 minutes), so that it may become impossible to monitor the processing state of a wafer W in the short time.

SUMMARY OF THE INVENTION

This invention is intended to solve the above problems. The object of this invention is to provide a plasma processing unit, a window member for a plasma processing unit and an electrode plate for a plasma processing unit, in which a process gas can be uniformly supplied into a processing container to conduct a uniform plasma process even if a window for monitoring is provided. In addition, this invention also provides a plasma processing unit, a window member for a plasma processing unit and an electrode plate for a plasma processing unit, in which the processing state of an object to be processed can be monitored for a long time.

This invention is a plasma processing unit including: a processing container; a first electrode disposed in the processing container, the first electrode having a plurality of gas-dispersion holes for supplying a process gas into the processing container and an opening for a measurement light; a second electrode arranged on one side of and a predetermined gap away from the gas-dispersion holes and the opening of the first electrode; a power source unit that applies electric power between the first electrode and the second electrode and that generates plasma between the first electrode and the second electrode; and a window member having an optical path that adjacently communicates with the other side of the opening for the measurement light; wherein the gas-dispersion holes are formed in a predetermined arrangement, and the opening is formed separately from the gas-dispersion holes without disturbing the arrangement of the gas-dispersion holes.

Preferably, the first electrode has a space, the space being connected to a process-gas supplying tube that supplies the process gas and communicating with the gas-dispersion holes.

Preferably, the space is shut off from the opening. More preferably, the space is also shut off from the optical path.

In addition, preferably, the opening and the optical path have such a long and narrow shape that it is hard for the plasma to come into the opening and the optical path. In the case, preferably, the opening and the optical path have an aspect ratio not less than 7, particularly an aspect ratio of about 9.8.

In addition, preferably, it further includes a laser-measurement unit that emits a laser beam into the processing container through the optical path of the window member and that receives and measures reflection of the beam from the processing container through the optical path.

In addition, preferably, the window member has a transparent plate arranged with an inclination with respect to a plane perpendicular to the optical path, on the opposite side to the opening side of the optical path.

Preferably, the gas-dispersion holes are formed in a substantially uniform arrangement in a whole surface of the first electrode.

Preferably, the opening is formed in a central portion of the first electrode, and one or more additional openings are also formed in the central portion of the first electrode.

In addition, this invention is a window member for a plasma processing unit, the plasma processing unit including: a processing container; a first electrode disposed in the processing container, the first electrode having a plurality of gas-dispersion holes for supplying a process gas into the processing container and an opening for a measurement light; a second electrode arranged on one side of and a predetermined gap away from the gas-dispersion holes and the opening of the first electrode; and a power source unit that applies electric power between the first electrode and the second electrode and that generates plasma between the first electrode and the second electrode; wherein the gas-dispersion holes are formed in a predetermined arrangement, the opening is formed separately from the gas-dispersion holes without disturbing the arrangement of the gas-dispersion holes, the first electrode has a space, the space being connected to a process-gas supplying tube that supplies the process gas and communicating with the gas-dispersion holes, and the space is shut off from the opening; the window member comprising: an optical path that adjacently communicates with the other side of the opening for the measurement light; wherein the optical path is adapted to be shut off from the space.

In the case, preferably, the opening and the optical path are adapted to form such a long and narrow shape that it is hard for the plasma to come into the opening and the optical path.

More preferably, a window member for a plasma processing unit further comprises: a transparent plate arranged with an inclination with respect to a plane perpendicular to the optical path, on the opposite side to the opening side of the optical path.

In addition, this invention is an electrode plate for a plasma processing unit comprising: a plurality of gas-dispersion holes for supplying a process gas; and an opening for a measurement light; wherein the gas-dispersion holes is formed in a predetermined arrangement, and the opening is formed separately from the gas-dispersion holes without disturbing the arrangement of the gas-dispersion holes.

DESCRIPTION OF THE DRAWINGS

FIG. 1 is a schematic view showing an embodiment of a plasma processing unit according to the invention;

FIG. 2 is a plan view showing an electrode plate of an upper electrode in the plasma processing unit shown in FIG. 1;

DESCRIPTION OF THE PREFERRED EMBODIMENT

Figure 3:
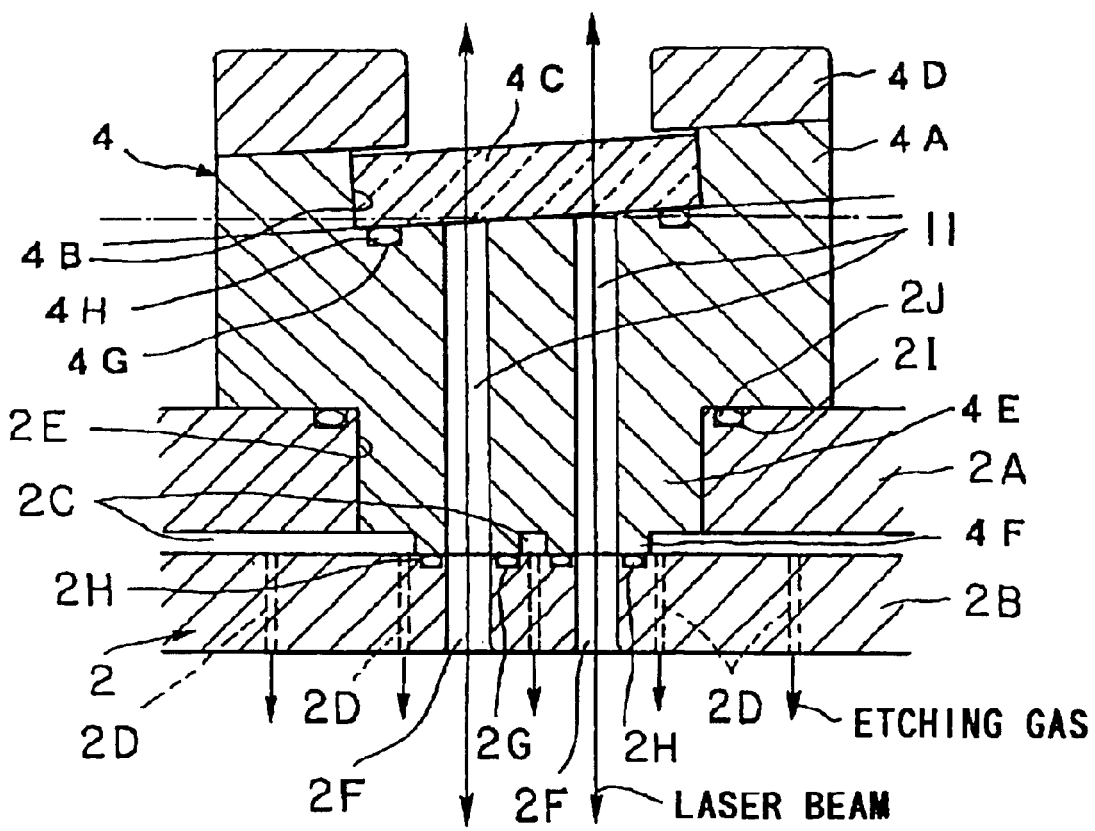
FIG. 3 is an enlarged sectional view showing a main part of the upper electrode in the plasma processing unit shown in FIG. 1.

This invention is explained based on an embodiment shown in FIGS. 1 to 4.

For example, as shown in FIG. 1, a plasma processing unit of the embodiment includes a processing container 1, an upper electrode 2 connected to a ground, and a lower electrode 3 that can also serve as a stage on which an object to be processed (for example, a wafer) W is placed. A plasma process (for example, an etching process) can be conducted to a wafer W by applying high-frequency electric power to the lower electrode 3 by means of a power source unit 3c. A window member 4 for monitoring the plasma process is provided at a central portion of the upper electrode 2. An end point of the etching process to the wafer W can be monitored through the window member 4. As a method of detecting the end point, there are a method of monitoring a surface state of the wafer W in the processing container 1, a method of monitoring plasma in the processing container 1, and so on.

As a method of monitoring a surface state of the wafer W, for example, a method of using laser-interference caused by optical reflection can be adopted. In such a method, as shown in FIG. 1, during the etching process, a laser beam L is emitted onto a surface of the wafer W in the processing container 1 from a He-Ne light source in a laser-measurement unit 5. The reflected interference-beam is measured by a laser interferometer. From a change of the interference-beam, an in-situ change of film thickness can be detected a via an end-point detector not shown. The laser interferometer includes for example, a half mirror, a mirror and a photo-sensor. In FIG. 1, 6 represents a gas-supplying tube for supplying a process gas, and 7 represents a gas-discharging tube for discharging the gas in the processing container 1.

In addition, as a method of monitoring plasma, for example, instrumental-analysis methods such as a mass spectrometry or an emission spectral analysis can be used. Among the methods, an emission spectral analysis of the plasma, which is relatively simple and sensitive, is broadly used as an end-point detecting method. In the case, an emission spectrum of a specified wavelength is received through the window for monitoring arranged on an end surface of the processing container, and a change of emission intensity of the specified wavelength is measured to detect the end point. For example, if a silicon oxide film is etched by using a CF etching gas such as $CF_4$ or the like, a specified wavelength of $Co_x$ being a reaction product (483.5 nm or the like) is detected in order to detect the end point.

Herein, the embodiment has a feature in the upper electrode 2 and the window member 4. As described below, the window member 4 is arranged in the upper electrode 2 without disturbing an arrangement of gas-dispersion holes, in other words, without sacrificing the number of necessary gas-dispersion holes. Thus, an etching gas is uniformly supplied through each of the gas-dispersion holes of the upper electrode 2. In addition, an etching state thereof can be monitored for a long time.

As shown in FIGS. 1 and 2, the upper electrode 2 of the embodiment has: an electrode body 2A forming a central portion of an upper wall of the processing container 1 and having a recess portion at an under surface thereof, and an electrode plate 2B removably attached to the under surface of the electrode body 2A by means of fastening members 9 such as screws to cover the recess portion. The recess portion forms a space 2C that can receive a process gas. The electrode body 2A is made of for example alumite-treated aluminum. As shown in FIG. 1, a gas-supplying tube 6 is connected to a position of the electrode body 2A deviated from the center thereof. The electrode plate 2B is made of for example alumite-treated aluminum, silicon, silicon carbide or carbon, as an expendable supply and has a diameter of for example 250 mm. As shown in FIGS. 1 and 2, many gas-dispersion holes 2D, each of which has a diameter of for example 0.8 mm, are formed in the whole surface of the electrode plate 2B, in a matrix-like arrangement. Thus, when an etching gas is supplied from the gas-supplying tube 6 into the upper electrode 2, the etching gas is uniformly jetted out from each of the gas-dispersion holes 2D of the electrode plate 2B toward the lower electrode 3.

Figure 4:
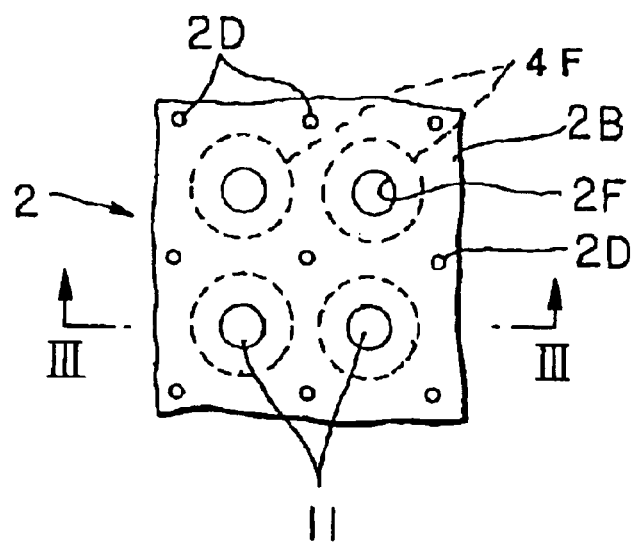
FIG. 4 is a plan view of FIG. 3 seen from thereunder.

In addition, as enlarged and shown in FIGS. 3 and 4, a hole 2E is formed at a central portion of the electrode body 2A. The window member 4 of the embodiment is removably attached into the hole 2E. For example four optical paths 11, each of which has a circular section, are formed as input-and-output paths for the laser beam. Openings 2F, each of which has the same diameter as each of the optical paths 11, are formed in the electrode plate 2B, correspondingly to the four optical paths 11, that is, just under each of the four optical paths 11. Thus, laser quantity necessary for the monitoring can go into and out from the lower electrode 3 through the four continuous openings 2F and optical paths 11. Then, the laser-measurement unit 5 can measure a change of film thickness: of the wafer W, which is processed in the processing container 1, under an in-situ condition. For example, the openings 2F and the optical paths 11 are formed to have the diameter of for example 5 mm. In addition, as shown in FIG. 2, each of the openings 2F is formed between adjacent gas-dispersion holes 2D, without interfering with the gas-dispersion holes 2D. Thus, the etching gas can be supplied uniformly from the whole surface of the electrode plate 2B.

Herein, as shown in FIG. 3, the window member 4 has: a main body 4A fitted in the hole 2E of the electrode body 2A, a recess portion 4B formed at an upper surface of the main body 4A, a transparent member such as a quartz glass member 4C fitted in the recess portion 4B, and a circular holding member 4D that fixes the quartz glass member 4C in the recess portion 4B. The four optical paths 11 vertically extend through the main body 4A, respectively. The main body 4A is made of a corrosion-resistant material such as alumite-treated aluminum, ceramics or the like. In addition, the main body 4A is made of a not-transparent material so that a quantity of light received in the laser-measurement unit 5 may not be affected by reaction products sticking thereto. As shown in FIG. 3, an upper surface of the main body 4A and a bottom surface of the recess portion 4B are parallel with each other and are a little inclined with respect to a horizontal plane. The quartz grass member 4C is fixed by the inclined bottom surface of the recess portion 4B. Thus, regarding the laser beam going into and out from the quartz glass member 4C, no beam reflected from a surface of the quartz glass member 4C comes back directly. Thus, a measurement about the beam from the surface of the wafer W, that is, a measurement of the change of the film thickness can not be disturbed. The main body 4A is fixed to the electrode body 2A by means of fastening means such as screws, which are not shown. In addition, the holding member 4D is fixed to the main body 4A by means of fastening means such as screws.

In addition, a circular small-diameter part 4E is formed at a lower portion of the main body 4A. A flange part is formed at a periphery of the small-diameter part 4E, so that when the window member 4 is fitted in the upper electrode 2, the small-diameter part 4E is fitted in the hole 2E of the upper electrode 2 and the flange part hermetically comes in contact with the electrode body 2A. A lower surface of the small-diameter part 4E is located at the same level as an inside surface of the electrode body 2A. Four circular protrusions 4F, each of which corresponds to each of the four openings 2F and has a diameter larger than that of the optical path 11, are formed on the lower surface of the small-diameter part 4E. The optical paths 11 extend through the centers of the circular protrusions 4F, respectively. Then, the openings 2F and the optical paths 11, which have the same diameter, are adjacently connected with each other and integrated as optical paths for the laser beam. Upper ends of the optical paths 11 are open at the recess portion 4B of the main body 4A. A ratio of a length of the integrated optical path consisting of the opening 2F and the optical path 11 to the diameter thereof (aspect ratio) is formed to be about 9.8. Thus, it is hard for suspended particles or reaction products in the plasma generated in the processing container 1 to diffuse into the optical paths, that is, to go into the optical paths. That is, it is prevented effectively that the suspended particles or the reaction products are stuck to and/or deposited on the quartz glass member 4C. In order to prevent the sticking and the deposition of the suspended particles or the reaction products onto the quartz glass member 4C, it is preferable that the aspect ratio of the optical path is set not less than 7.

In addition, grooves 2G, each of which surrounds each of the four openings 2F, are formed in an inside surface of the electrode plate 2B. Sealing members 2H such as O-rings are fitted in the grooves 2G, respectively. In addition, a groove 2I surrounding the hole 2S is formed in an outside surface of the electrode body 2A. A sealing member 2J such as an O-ring is fitted in the groove 2I. Thus, when the window member 4 is attached to the upper electrode 2 so that the small-diameter part 4E of the main body 4A is fitted in the hole 2E of the upper electrode 2, the flange part of the main body 4A and the circular protrusions 4F come in contact with the outside surface of the electrode body 2A and the inside surface of the electrode plate 2B, respectively. Then, by means of the respective sealing members 2I and 2H, the space 2C of the upper electrode 2 is shut off from-.an inside space of the processing container 1. In addition, grooves 4G respectively surrounding the four optical paths 11 are formed in the bottom surface of the recess portion 4B of the window member 4. Sealing members 4H such as O-rings are fitted in the grooves 4G. Thus, the processing container 1 is shut off from an outside thereof.

Next, an operation of the embodiment is explained. At first, in a state wherein a vacuum of a predetermined level is maintained in the processing container 1 and a wafer W is placed on the lower electrode 3, the etching gas is supplied into the space 2C of the upper electrode 2. As shown by arrows in FIG. 1, the etching gas is jetted into the processing container 1 through each of the gas-dispersion holes 2D of the electrode plate 2B. The gas-dispersion holes 2D are uniformly arranged in the whole surface of the electrode plate 2B in the matrix-like arrangement without sacrificed by the openings 2F. Thus, the etching gas is uniformly supplied into the processing container 1 from the whole surface of the electrode plate 2B of the upper electrode 2. Then, uniform plasma can be generated between the upper electrode 2 and the lower electrode 3 in the processing container 1, by applying electric power from the power source unit 3C. At that time, since the diameter of each of the openings 2F is small, an electric field of the electrode plate 2B may not be affected badly. Thus, more uniform plasma can be generated, so that more uniform etching process can be conducted to the wafer W.

Then, a laser beam for monitoring a surface of the wafer W goes onto the surface of the wafer W in the processing container 1 through the optical paths 11 of the window member 4 and the openings 2F of the electrode plate 2B. The reflected beam goes out from the openings 2F and the optical paths 11, goes into the laser interferometer, and is used for monitoring an in-situ change of film thickness of the wafer W. Since the optical paths consisting of the continuous optical paths 11 and openings 2F have a large aspect ratio, it is difficult for suspended particles and reaction products in the plasma to diffuse in (goes into) the optical paths. Thus, it can be prevented that they may be stuck to and deposited on the quartz glass member 4C. Thus, the quartz glass member 4C can maintain a transmissivity thereof for a long time, so that the laser interferometer can be used continuously for a long time, that is, an end point of the etching process can be detected for a long time.

If the etching process has been conducted for a long time and reaction products or the like have been stuck to the electrode plate 2B, the electrode plate 2B can be removed from the electrode body 2A and can be subjected to a cleaning process. In addition, if the electrode plate 2B is damaged by a spattering effect of the plasma because of a longer use, the damaged electrode plate 2B can be replaced with a new electrode plate 2B.

As described above, according to the embodiment, since the four openings 2F that can secure necessary quantity of light are provided in the upper electrode 2 between the gas-dispersion holes 2D without sacrificing the arrangement of the gas-dispersion holes 2D, and since the openings 2F are adjacently connected to the four optical paths 11 of the window member 4, respectively, the etching gas can be uniformly supplied into the processing container 1 from the electrode plate 2B, so that an uniform etching process can be conducted to the wafer W, in spite of existence of the openings 2F for monitoring in the electrode plate 2B.

In addition, according to the embodiment, since the sealing members 2H are provided on joining surfaces of the main body 4A of the window member 4 and the electrode plate 2B so that the optical paths 11 of the window member 4 are shut off from the neighboring dispersion holes 2D, the process gas may not flow into the optical paths 11 of the window member 4 from the inside space 2C of the upper electrode 2. Then, the etching gas can be reliably supplied into the processing container 1 from the inside of the upper electrode 2 without any leakage, so that the etching gas can be supplied more uniformly from the electrode plate 2B.

In addition, according to the embodiment, since the optical paths for the measurement beam are formed by the openings 2F and the optical paths 11, which have a high aspect ratio, that is, which have such a long and narrow shape that it is difficult for the plasma to diffuse (come) therein, it is difficult for the suspended particles and reaction products in the plasma to stick to and be deposited on the quartz glass member 4C. Thus, the transmissivity of the quartz glass member 4C can be maintained for a long time, so that a processing state of the wafer can be monitored for a long time.

This invention is not limited to the above embodiment, but respective designs of its components can be suitably changed or modified if necessary. For example, although one window member 4 is provided at the central portion of the upper electrode 2 in the above embodiment, the window member 4 can be disposed at any other position, and additional one or more window members can be provided. In addition, although the four openings 2F are provided in the above embodiment, the number thereof can be increased or decreased based on the quantity of light. Although the gas-dispersion holes 2D are formed in the matrix-like arrangement in the electrode plate 2B, they can be formed in any other arrangement. Although the laser beam is emitted for detecting an end point of the process in the above embodiment, any other beam that can be used as a measurement beam, such as a white light beam, can be emitted. In addition, although the above plasma processing unit is for etching the wafer, this invention is broadly applicable to any other plasma processing unit that uses plasma. This invention is also applicable to any processing unit that conducts a process to any object to be processed other than a wafer.

As described above, according to the invention, a plasma processing unit, a window member for a plasma processing unit and an electrode plate for a plasma processing unit can be provided, in which a process gas can be uniformly supplied into a processing container to conduct a uniform plasma process, in spite of existence of an opening and an optical path as a window for monitoring.

What is claimed is:

1. A plasma processing unit comprising;
   a processing container,
   a first electrode disposed in the processing container, the first electrode having a space connected to a process-gas supplying tube that supplies a process gas, a plurality of gas-dispersion holes formed on one side with respect to the space for supplying the process gas into the processing container, and an opening for a measurement of light formed on the side with respect to the space,
   a second electrode arranged on one side of a predetermined gap away from the gas-dispersion holes and the opening of the first electrode,
   a power source unit that applies electric power between the first electrode and the second electrode and that generates plasma between the first electrode and the second electrode,
   a window member having a non-transparent main body and a transparent material, the non-transparent main body having an optical path that adjacently communicates with the other side of the opening for the measurement of light, and a circular protrusion extending so as to surround the optical path and to come into contact with the first electrode, and
   a sealing member that is provided at the circular protrusion of the non-transparent main body to cause the space to be shut off from the optical path.

2. A plasma processing unit according to claim 1, wherein:
   the opening and the optical path have an aspect ratio not less than 7.

3. A plasma processing unit according to claim 1, further comprising:
   a laser-measurement unit that emits a laser beam into the processing container through the optical path of the window member and that receives and measures reflection of the beam from the processing container through the optical path.

4. A plasma processing unit according to claim 1, wherein:
   the opening is formed in a central portion of the first electrode, and
   one or more additional openings are also formed in the central portion of the first electrode.

5. A plasma processing unit according to claim 1, wherein:
   the transparent material is a transparent plate arranged with an inclination with respect to a plane perpendicular to the optical path, on the side opposite the opening side of the optical path.

6. A plasma processing unit according to claim 5, wherein the opening and the optical path have an aspect ratio not less than 7.

7. A plasma processing unit according to claim 5, further comprising:
   a laser-measurement unit that emits a laser beam into the processing container through the optical path of the window member and that receives and measures reflection of the beam from the processing container through the optical path.

8. A plasma processing unit according to claim 5, wherein:
   the opening is formed in a central portion of the first electrode, and
   one or more additional openings are also formed in the central portion of the first electrode.

* * * * *